(12) United States Patent
Lin et al.

(10) Patent No.: US 7,903,444 B2
(45) Date of Patent: Mar. 8, 2011

(54) ONE-TIME PROGRAMMABLE MEMORY AND OPERATING METHOD THEREOF

(75) Inventors: Chrong-Jung Lin, Hsinchu (TW); Ya-Chin King, Taipei (TW)

(73) Assignees: Chrong-Jung Lin, Hsinchu (TW); Ya-Chin King, Taipei (TW)

( * ) Notice: Subject to any disclaimer, the term of this patent is extended or adjusted under 35 U.S.C. 154(b) by 491 days.

(21) Appl. No.: 12/146,753

(22) Filed: Jun. 26, 2008

(65) Prior Publication Data

US 2009/0323387 A1    Dec. 31, 2009

(51) Int. Cl.
*G11C 17/00* (2006.01)

(52) U.S. Cl. .......................... 365/94; 365/102

(58) Field of Classification Search .............. 365/94, 365/102, 104; 257/415, 296
See application file for complete search history.

(56) References Cited

U.S. PATENT DOCUMENTS 7,161,218 B2 * 1/2007 Bertin et al. ............ 257/415
2008/0019165 A1    1/2008 Lin et al.

* cited by examiner

*Primary Examiner* — Vu A Le
(74) *Attorney, Agent, or Firm* — Thomas, Kayden, Horstemeyer & Risley, LLP

(57) ABSTRACT

A one-time programmable memory cell is provided, the one-time programmable memory cell comprises: a gate dielectric layer disposed on a well; a gate electrode disposed on the gate dielectric layer; source/drain regions disposed in the well at the sides of the gate electrode, respectively; a first salicide layer disposed on one of the source/drain regions; a capacitive dielectric layer disposed on the gate electrode and the other of the source/drain regions; a first conductive plug disposed on the first salicide layer; and a second conductive plug disposed on the capacitive dielectric layer. The size of the first conductive plug is different form the size of the second conductive plug.

20 Claims, 5 Drawing Sheets

ONE-TIME PROGRAMMABLE MEMORY AND OPERATING METHOD THEREOF

BACKGROUND

1. Field of Invention

The present invention relates to a semiconductor device. More particularly, the present invention relates to a one-time programmable memory cell and an operating method thereof.

2. Description of Related Art

Non-volatile memory, nonvolatile memory, NVM or non-volatile storage, is computer memory that can retain the stored information even when not powered. Examples of non-volatile memory include read-only memory, flash memory, most types of magnetic computer storage devices (e.g. hard disks, floppy disk drives, and magnetic tape), optical disc drives, and early computer storage methods such as paper tape and punch cards.

However, since the invention of the integrated circuit, the semiconductor industry has experienced continued rapid growth due to continuous improvements in the integration density of various electronic components (i.e. memory cell, etc). For the most part, this improvement in memory capacity demand has come from repeated reductions in minimum feature size, which allows more components to be integrated into a given area.

For the foregoing reasons, there is a need for a new one-time programmable memory cell and the operating method thereof.

SUMMARY

It is therefore an objective of the present invention to provide a one-time programmable memory cell.

In accordance with an embodiment of the present invention, the one-time programmable memory cell, comprises: a gate dielectric layer disposed on a well; a gate electrode disposed on the gate dielectric layer; source/drain regions disposed in the well and located at opposing sides of the gate electrode, respectively; a first salicide layer disposed on one of the source/drain regions; a capacitive dielectric layer disposed on the other of the source/drain regions; a first conductive plug disposed on the first salicide layer; and a second conductive plug disposed on the capacitive dielectric layer, where the size of the first conductive plug is different form the size of the second conductive plug.

It is another objective of the present invention to provide an operating method for reading the one-time programmable memory cell.

In accordance with another embodiment of the operating method for reading the one-time programmable memory cell, which comprises that applying a first electrical potential to the first conductive plug; applying a second electrical potential to the second conductive plug; applying a third electrical potential is applied to the gate electrode; and applying a fourth electrical potential is applied to the well. The third electrical potential is set to turn on a channel under the gate dielectric layer, and the first electrical potential is different from the second electrical potential, which is set to generate a current in the channel.

It is another objective of the present invention to provide another one-time programmable memory cell.

In accordance with another embodiment of the one-time programmable memory cell, comprises: a gate dielectric layer disposed on a well; a gate electrode disposed on the gate dielectric layer; source/drain regions disposed in the well and located at opposing sides of the gate electrode, respectively; two lightly doped drains disposed on the source/drain regions, respectively; a first salicide layer disposed on one of the two lightly doped drains; a capacitive dielectric layer disposed on the other of two lightly doped drains; a first conductive plug disposed on the first salicide layer; and a second conductive plug disposed on the capacitive dielectric layer, where the size of the first conductive plug is different form the size of the second conductive plug.

It is to be understood that both the foregoing general description and the following detailed description are by examples, and are intended to provide further explanation of the invention as claimed.

BRIEF DESCRIPTION OF THE DRAWINGS

For a more complete understanding of the present invention, and the advantages thereof, reference is now made to the following descriptions taken in conjunction with the accompanying drawing, in which.

DESCRIPTION OF THE PREFERRED EMBODIMENTS

Figure 1A:
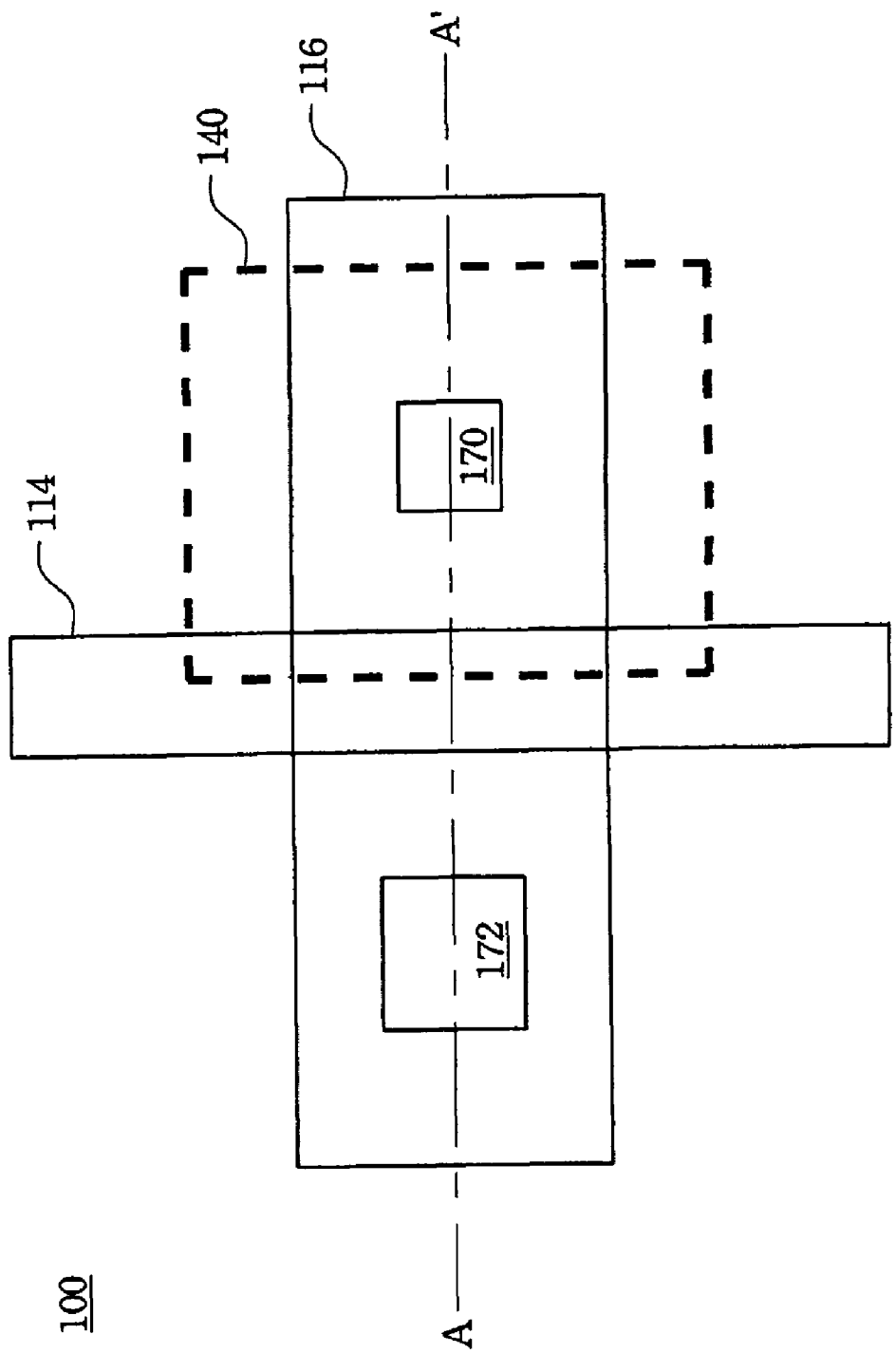
FIG. 1A is a schematic top view illustrating a one-time programmable memory cell according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
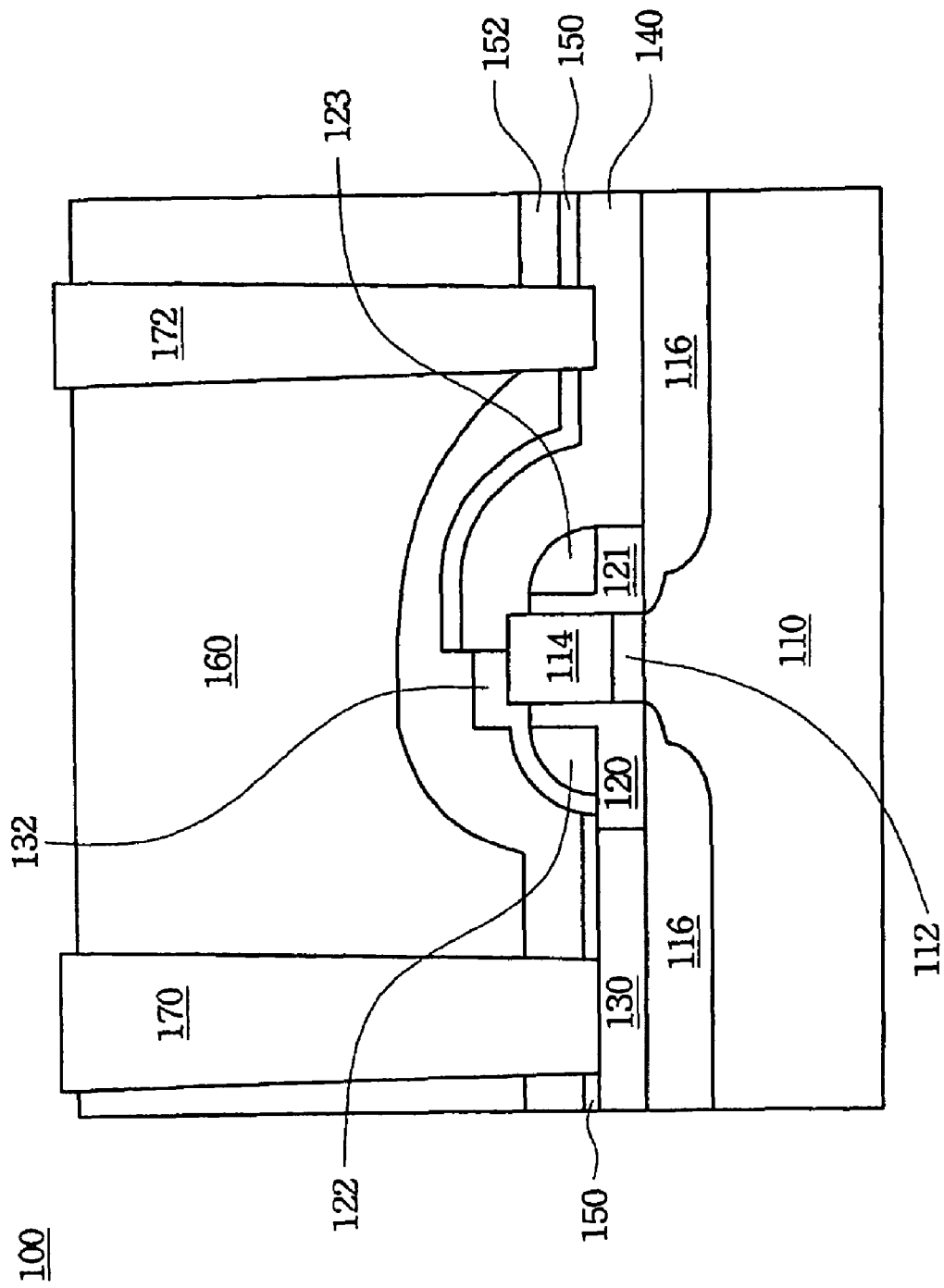
FIG. 1B is a cross-sectional view taken along line A-A' in FIG. 1A.

Please refer to FIG. 1A and FIG. 1B. FIG. 1A is a schematic top view illustrating a one-time programmable memory cell 100 according to an embodiment of the present invention. FIG. 1B is a cross-sectional view taken along line A-A' in FIG. 1A. The one-time programmable memory cell 100 may comprise a well 110. The well 110 to provide isolation for the one-time programmable memory cell formed therein. In one way or another, the well 110 may be an N-well formed by implanting or diffusing an N-type ion, such as arsenic or phosphorous ions into a portion of a substrate. Alternatively, the well 110 may be a P-well formed by implanting or diffusing a P-type ion, such as boron ions, into a portion of a substrate. The substrate may comprise bulk silicon, doped, un-doped, thin film or SOI substrate. In an embodiment, the substrate comprises bulk silicon having a <100> or <110>-crystal orientation.

Furthermore, the one-time programmable memory cell 100 may also comprise gate, drain and source. The gate dielectric layer 112 and the gate electrode 114 are formed and patterned on the well 110, where the gate electrode 114 is disposed on the gate dielectric layer 112. The gate dielectric layer 112 is preferably a high-K dielectric material, such as silicon oxide, silicon oxynitride, silicon nitride, an oxide, a nitrogen-containing oxide, a combination thereof, or the like. Preferably, the gate dielectric layer 112 has a relative permittivity value greater than about 4. Other examples of such materials include aluminum oxide, lanthanum oxide, hafnium oxide, zirconium oxide, hafnium oxynitride, or combinations thereof. The gate electrode 114 may comprise a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof. Moreover, the source/drain regions 116 are disposed in the well 110 and located at opposing sides of the gate electrode 114, respectively. For example, in the well 110, one of the source/drain regions 116 may be located at the left side of the gate electrode 114, and the other of the source/drain regions 116 may be located at the right side of the gate electrode 114, where the one of the source/drain regions 116 stands away from the other of the source/drain regions 116. In an embodiment, P-type ions, such as boron or $BF_2$ ions, are implanted to create the heavily-doped source/drain regions 116 for a PMOS device, and N-type ions, such as arsenic or phosphorous ions, are implanted to create the heavily-doped source/drain regions 116 for an NMOS device.

Furthermore, the one-time programmable memory cell 100 may also comprise liners and/or spacers. The first liner 120 and the second liner 121 are disposed alongside the gate electrode 114, respectively. The first spacer 122 is disposed on the first liner 120; and the second spacer 123 is disposed on the second liner 121. The first and second spacers 122, 123 may be dielectric material, such as silicon oxide, silicon nitride, a combination thereof, or the like.

Furthermore, the one-time programmable memory cell 100 may also comprise salicide layers, etch stop layers and conductive plugs. The first salicide layer 130 is disposed on one of the source/drain regions 116; the second salicide layer 132 is disposed on a portion of the gate electrode 114; and the capacitive dielectric layer 140, which may be a resistive protection oxide layer or a self-aligned silicide block layer, lies on another portion of the gate electrode 114, the second liner 121, the second spacer 123 and the other of the source/drain regions 116. The first etch stop layer 150 overlays the first salicide layer 130, the first liner 120, the first spacer 122, the second salicide layer 132 and the capacitive dielectric layer 140. The second etch stop layer 152 overlays the first etch stop layer 150. The interlayer insulating (ILD) layer 160 overlays the second etch stop layer 152. The first conductive plug 170 extends through the interlayer insulating layer 160 and the first etch stop layers 150 and the second etch stop layers 152, additionally, the first conductive plug 170 contacts with the first salicide layer 130. The second conductive plug 172 extends through the interlayer insulating layer 160 and the first etch stop layers 150 and the second etch stop layers 152, additionally, the second conductive plug 172 contacts with the capacitive dielectric layer 140. The size of the first conductive plug 170 is preferably different form the size of the second conductive plug 172. Moreover, it should be appreciated that the different contact size can be implemented or defined in layout drawing or data printed on photo mask (which means the contact size is processed with logic operation when preparing the e-beam data), to well control the programming uniformity of the one-time programmable memory cell. In semiconductor processing, the small contact/plug size usually means slow contact/plug etching capability. In certain technology, if the size of the first conductive plug 170 is same as that of the second conductive plug 172, the contact plug etching process may etch away the capacitive dielectric layer 140 and after that, the contact plug may touch the source/drain region 116 directly. In this way, there is no dielectric layer 140 for dielectric breakdown during the programming operation. Therefore, this one-time-programmable memory cell 100 fails. To solve this problem, a smaller size of the second conductive plug 172 is preferred to make the etching capability weaker and make sure the remaining capacitive dielectric layer 140 is enough for programming operation. Other advantages of this setting are that no additional space is required, and the integration of the semiconductor devices is elevated.

Moreover, in some real case, there is only one etching stop layer 150 for contact etching process. Etching stop layer 152 is not necessary for integrating into semiconductor process.

Moreover, it should be appreciated that one side of the source/drain region 116 is not necessary the fully salicided one or fully non-salicided one. It means the one of source/drain region 116 may contain mostly the salicide layer 130 and some small portion of the capacitive dielectric layer 140. In another case, the other one of source/drain region 116 may contain mostly the capacitive dielectric layer 140 and some small portion of the salicide layer 130. It depends on the memory cell design rule and some misalignment consideration. The same condition can be applied to one or more layers, such as the capacitive dielectric layer and/or the second salicide layer, disposed on the gate electrode 114. For example, the second salicide layer 132 is disposed on a portion of the gate electrode and the capacitive dielectric layer 140 is disposed on another portion of the gate electrode 114.

Moreover, in memory array, the size of the second conductive plug 172 is different from the contact plug size of the peripheral logic device, where the peripheral logic device is electrically connected with the one-time programmable memory cell or located outside of memory circuits.

Moreover, it would be appreciated that the size of the second conductive plug 172 varies from the center of memory array and the edge of memory array. For making processing more stability, the size of the second conductive plug 172 varies from the center of silicon wafer and the edge of silicon wafer.

Please continue to refer to FIG. 1B. An operating method is used for the one-time programmable memory cell 100 according to an embodiment of the present invention. According to the operating method, a first electrical potential is applied to the first conductive plug 170; a second electrical potential is applied to the second conductive plug 172; a third electrical potential is applied to the gate electrode 114; and a fourth electrical potential is applied to the well 110. When programming, the third electrical potential is such set to turn on a channel under the gate dielectric layer 112, the first electrical potential, the second electrical potential and the fourth electrical potential are such set to make the capacitive dielectric layer 140 breakdown.

Moreover, the one-time programmable memory cell 100 may be an N-channel one-time programmable memory cell, in which the well 110 is the P-well and the source/drain regions 116 are N-type source/drain regions. When reading, the third electrical potential is greater than the fourth electrical potential, which may turn on a channel under the gate dielectric layer 112. Furthermore, the first electrical potential may be greater than the second electrical potential, which can initialize the bias difference at the source/drain regions 116, so that current flow from the first electrical potential to the second electrical potential; contrarily, the second electrical potential may be greater than the first electrical potential, which can initialize the bias difference at the source/drain regions 116, so that current flow from the second electrical potential to the first electrical potential. In addition, the first and second electrical potential are greater than or equal to the fourth electrical potential, which may prevent a junction forward, where the junction is between the well 110 and the source/drain regions.

On the other hand, the one-time programmable memory cell 100 may be a P-channel one-time programmable memory cell, in which the well 110 is the N-well and the source/drain regions 116 are P-type source/drain regions. When reading, the fourth electrical potential is greater than the third electrical potential, which may turn on a channel under the gate dielectric layer 112. Furthermore, the first electrical potential may be greater than the second electrical potential, which can initialize the bias difference at the source/drain regions 116, so that current flow from the first electrical potential to the second electrical potential; contrarily, the second electrical potential may be greater than the first electrical potential, which can initialize the bias difference at the source/drain regions 116, so that current flow from the second electrical potential to the first electrical potential. In addition, the fourth electrical potential is greater than or equal to the first and second electrical potential, which may prevent a junction forward, where the junction is between the well 110 and the source/drain regions.

Figure 2A:
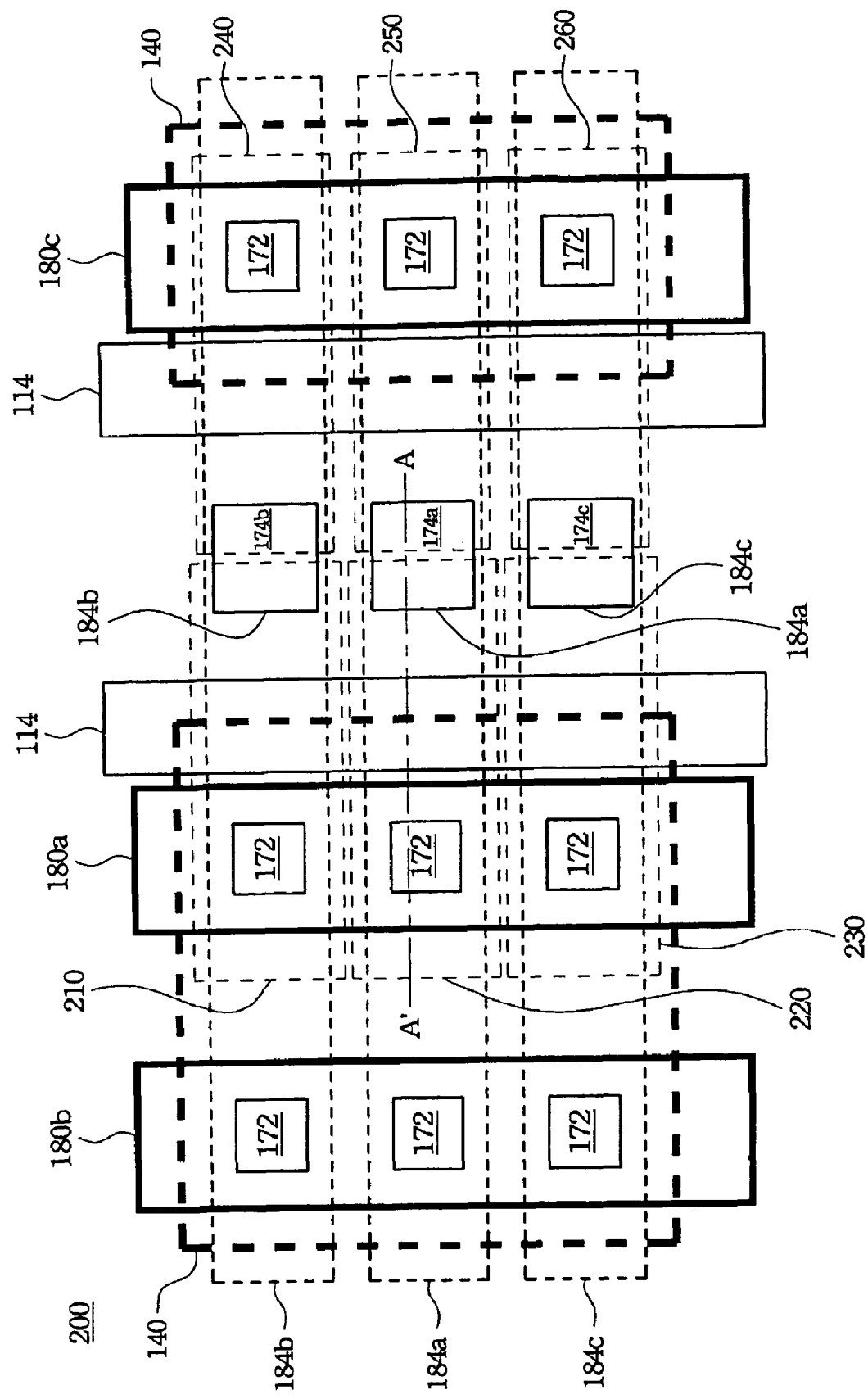
FIG. 2A is a schematic top view illustrating a portion of a memory cell array according to an embodiment of the present invention.
Figure 2B:
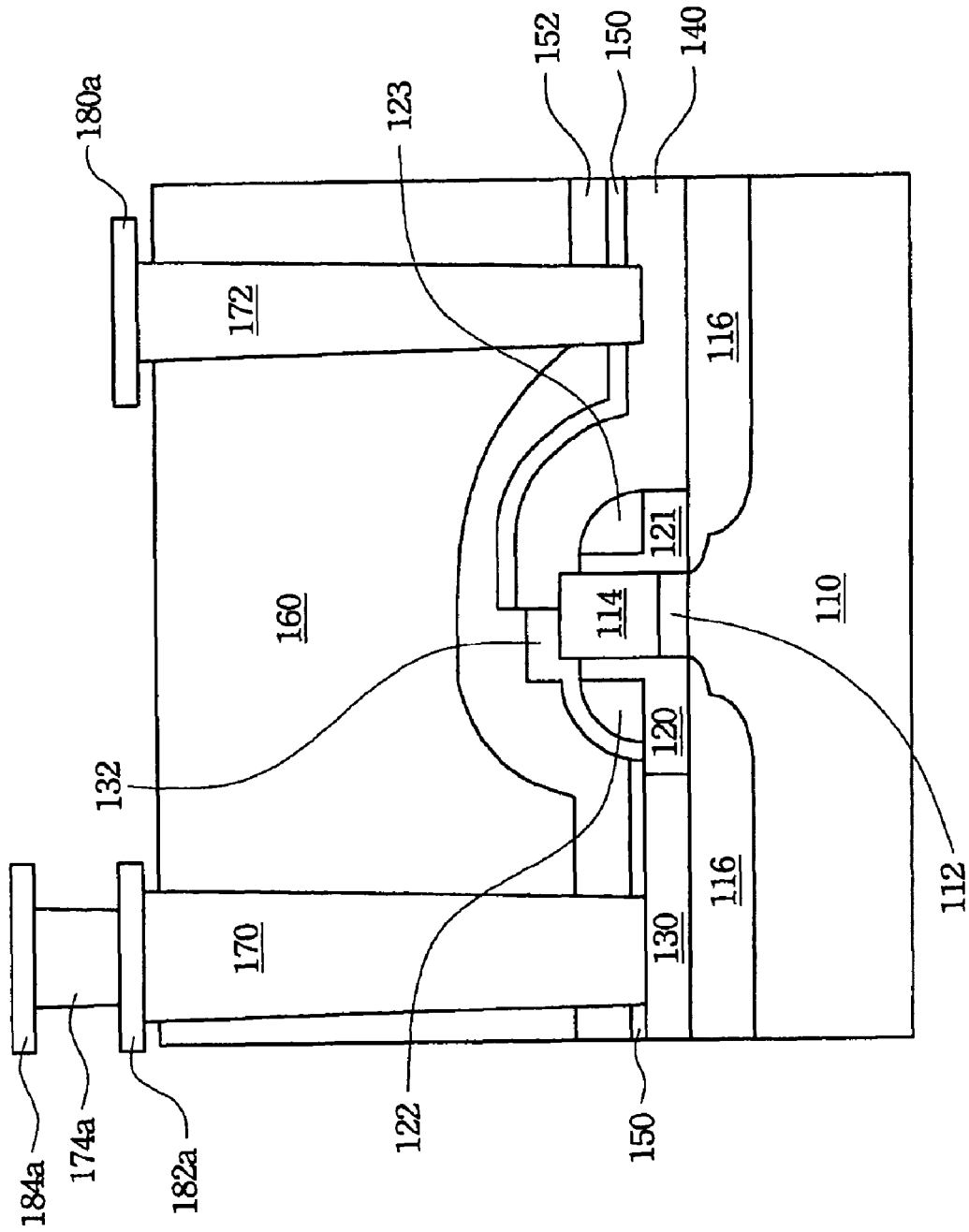
FIG. 2B is a cross-sectional view illustrating a one-time programmable memory cell taken along line A-A' in FIG. 2A.

Please refer to FIG. 2A and FIG. 2B. FIG. 2A is a schematic top view illustrating a portion of a memory cell array 200 according to an embodiment of the present invention. FIG. 2B is a cross-sectional view illustrating a one-time programmable memory cell 210 taken along line A-A' in FIG. 2A. The memory cell array 200 comprises a plurality of the one-time programmable memory cells, such as the one-time programmable memory cells 210,220,230,240,250,260 illustrated in FIG. 2A. FIG. 2B assumes the one-time programmable memory cell 220 in a manner similar to that discussed above with reference to FIG. 1B, wherein like reference numerals refer to like elements. However, the one-time programmable memory cell 220 further comprises a first metal line 180*a*, a second metal line 182*a*, a third metal line 184*a* and a third conductive plug 174*a*. The first metal line 180*a* and the second metal line 182*a* are formed and patterned on the interlayer insulating layer 160*a*. The first metal line 180*a* connects with the second conductive plug 172; and the second metal line 182*a* connects with the first conductive plug 170. The third metal line 184*a* is disposed above the second metal line 182*a*. The third conductive plug 174*a*, which is disposed between the second metal line 182*a* and the third metal line 184*a*, connects the second metal line 182*a* and the third metal line 184*a*. Accordingly, each of the other one-time programmable memory cells corresponds to the one-time programmable memory cell 220 of FIG. 2A. Moreover, it should be noted that the one-time programmable memory cells 210, 220,230 are electrically connected together via the first metal line 180*a*, similarly, the one-time programmable memory cells 240,250,260 are electrically connected together via the first metal line 180*c*. The first metal lines 180*a*, 180*b*, 180*c* may be perpendicular to the third metal lines 184*a*, 184*b*, 184*c* and may be parallel to the gate electrode 114. It should be appreciate that the one-time programmable memory cells 220,250 may share the third conductive plug 174*a*, similarly, the one-time programmable memory cells 210,240 may share the third conductive plug 174*b*, and the one-time programmable memory cells 230,260 may share the third conductive plug 174*c*.

Please continue to refer to FIG. 2A and FIG. 2B. An operating method is used for the memory cell array 200 according to an embodiment of the present invention. According to the operating method for the memory cell array 200, each first metal line may act as a source line, and each third metal line may act as a select line. When programming the one-time programmable memory cell 220, a first electrical potential, such as 0 voltage, is applied to the third metal line 184*a*; a second electrical potential, such as 6 voltage, is applied to the first metal line 180*a*; a third electrical potential, such as 1.5 voltage, is applied to the gate electrode 114 of the one-time programmable memory cell 220; and a fourth electrical potential is applied to the well 110. The third electrical potential is such set to turn on a channel under the gate dielectric layer 112. The first electrical potential, the second electrical potential and the fourth electrical potential are such set to make the capacitive dielectric layer 140 breakdown. Furthermore, for any un-programmed the one-time programmable memory cell in the memory cell array 200, the third metal line may be floating; the first metal line may be floating, or may be applied the same as the second electrical potential, such as 6 voltage; and the gate electrode may be applied a fifth electrical potential, where the fifth electrical potential may differ form the third electrical potential, for example, the fifth electrical potential is 0 voltage and the third electrical potential is 1.5 voltage.

On the other hand, when reading the one-time programmable memory cell 220, a first electrical potential, such as 1.5 voltage, is applied to the third metal line 184*a*; a second electrical potential, such as 0 voltage, is applied to the first metal line 180*a*; a third electrical potential, such as 1.5 voltage, is applied to the gate electrode 114 of the one-time programmable memory cell 220; and a fourth electrical potential, such as 0 voltage, is applied to the well 110. The third electrical potential is such set to turn on a channel under the gate dielectric layer 112, and the first electrical potential is different from the second electrical potential, which is set to generate a current in the channel. As the one-time programmable memory cell is an N-channel one-time programmable memory cell, the second electrical potential is greater than or equal to the fourth electrical potential, and the third electrical potential is greater than the fourth electrical potential. The first electrical potential is greater than the second electrical potential, and the current flows from the first electrical potential to the second electrical potential; alternatively the first electrical potential is less than the second electrical potential, and the current flows from the second electrical potential to the first electrical potential. On the contrary, as the one-time programmable memory cell is a P-channel one-time programmable memory cell, the second electrical potential is less than or equal to the fourth electrical potential, and the third electrical potential is less than the fourth electrical potential. The first electrical potential is greater than the second electrical potential, and the current flows from the second electrical potential to the first electrical potential; alternatively the first electrical potential is less than the second electrical potential, and the current flows from the first electrical potential to the second electrical potential.

Furthermore, for any unread the one-time programmable memory cell, the third metal line may be floating; the first metal line may be floating, or may be applied the same as the second electrical potential, such as 0 voltage; and the gate electrode may be applied a fifth electrical potential, where the fifth electrical potential may differ from the third electrical potential, for example, the fifth electrical potential is 0 voltage and the third electrical potential is 1.5 voltage.

Figure 3:
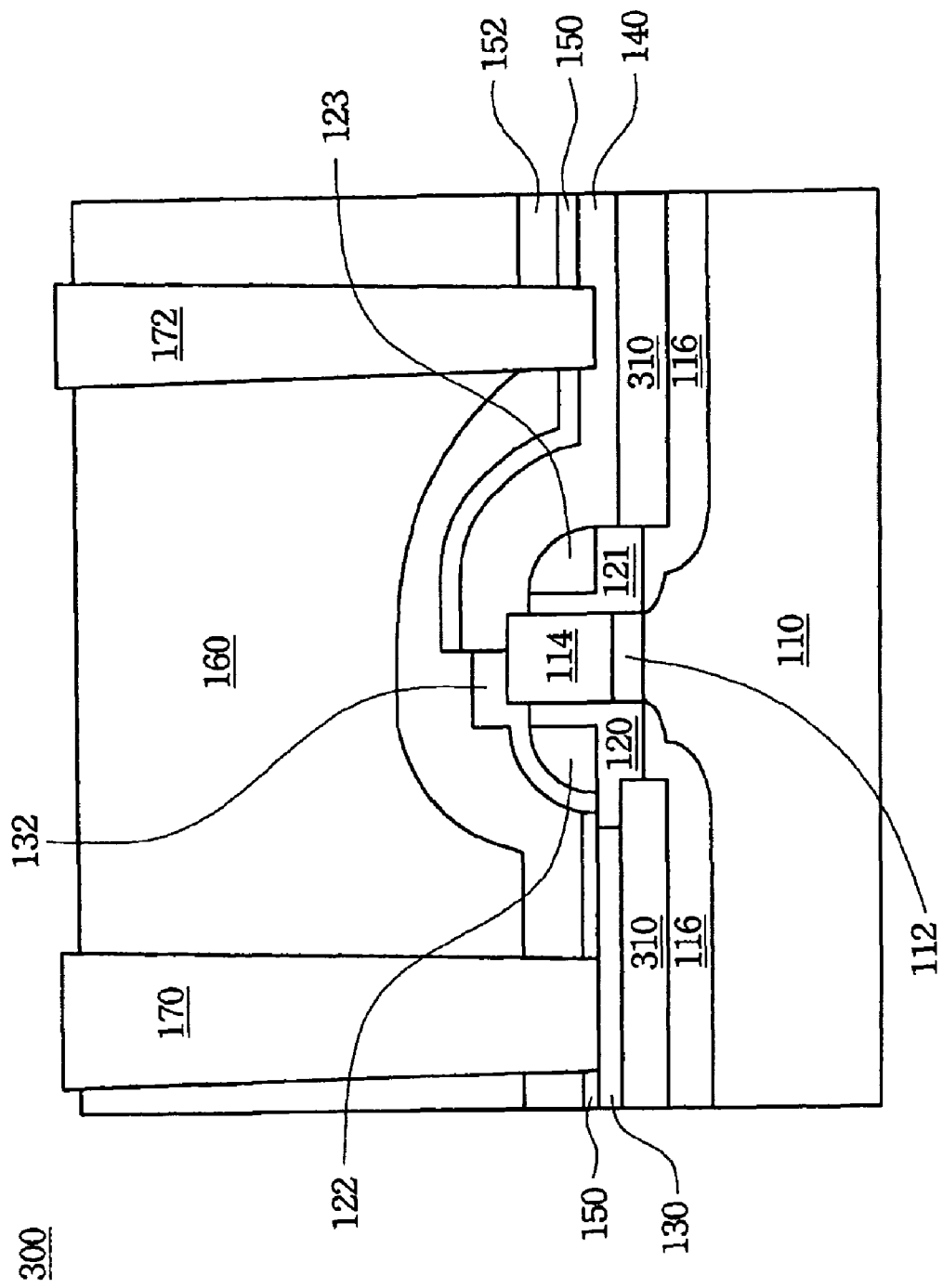
FIG. 3 is a cross-sectional view illustrating a one-time programmable memory cell according to an embodiment of the present invention.

Please refer to FIG. 3. FIG. 3 is a cross-sectional view illustrating a one-time programmable memory cell 300. FIG. 3 assumes the one-time programmable memory cell 300 in a manner similar to that discussed above with reference to FIG. 1B, wherein like reference numerals refer to like elements. However, the one-time programmable memory cell 300 further comprises lightly doped drains (LDD) 310. For example, the lightly doped drains 310 may be formed by implanting P-type ions, such as boron or BF2 ions, to form a PMOS device, and/or implanting N-type ions, such as arsenic or phosphorous ions, for an NMOS device. An anneal procedure, such as a rapid thermal anneal (RTA) procedure, may be employed to activate the implanted ions of the lightly doped drains 310. In FIG. 3, one of the lightly doped drains 310 are disposed between the first salicide layer 130 and one of the source/drain regions 116, the other of the lightly doped drains 310 are disposed between the capacitive dielectric layer 140 and the other of the source/drain regions 116. The lightly doped drains may be doped additionally to have conductivity opposite the source/drain regions 116. Thus, it should be appreciate that the lightly doped drain connects with the source/drain region, which may act as a diode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A one-time programmable memory cell, comprising:
    a gate dielectric layer disposed on a well;
    a gate electrode disposed on the gate dielectric layer;
    source/drain regions disposed in the well and located at opposing sides of the gate electrode, respectively;
    a first salicide layer disposed on one of the source/drain regions;
    a capacitive dielectric layer disposed on the other of the source/drain regions;
    a first conductive plug disposed on the first salicide layer; and
    a second conductive plug disposed on the capacitive dielectric layer, wherein the size of the first conductive plug is different form the size of the second conductive plug.
2. The one-time programmable memory cell as claimed in claim 1, wherein the capacitive dielectric layer is a resistive protection oxide layer or a self-aligned silicide block layer.
3. The one-time programmable memory cell as claimed in claim 1, wherein the capacitive dielectric layer is disposed on the gate electrode.
4. The one-time programmable memory cell as claimed in claim 1, further comprising:
    a second salicide layer disposed on the gate electrode.
5. The one-time programmable memory cell as claimed in claim 1, further comprising:
    a second salicide layer disposed on a portion of the gate electrode, wherein the capacitive dielectric layer is disposed on another portion of the gate electrode.
6. Two one-time programmable memory cells as claimed in claim 1 are fabricated in semiconductor wafer's center and edge, respectively, wherein the size of the second conductive plug of the memory cell in wafer center is different from that of the other memory cell in wafer edge.
7. Two one-time programmable memory cells as claimed in claim 1 are integrated in memory array's center and edge, respectively, wherein the size of the second conductive plug of the memory cell in array center is different from that of the other memory cell in array edge.

8. An operating method for reading the one-time programmable memory cell of claim 1, which comprises:
    applying a first electrical potential to the first conductive plug;
    applying a second electrical potential to the second conductive plug;
    applying a third electrical potential is applied to the gate electrode; and
    applying a fourth electrical potential is applied to the well, wherein the third electrical potential is set to turn on a channel under the gate dielectric layer, and the first electrical potential is different from the second electrical potential, which is set to generate a current in the channel.
9. The operating method as claimed in claim 8, wherein the one-time programmable memory cell is an N-channel one-time programmable memory cell, the second electrical potential is greater than or equal to the fourth electrical potential, and the third electrical potential is greater than the fourth electrical potential.
10. The operating method as claimed in claim 9, wherein the first electrical potential is greater than the second electrical potential, and the current flows from the first electrical potential to the second electrical potential.
11. The operating method as claimed in claim 9, wherein the first electrical potential is less than the second electrical potential, and the current flows from the second electrical potential to the first electrical potential.
12. The operating method as claimed in claim 8, wherein the one-time programmable memory cell is a P-channel one-time programmable memory cell, the second electrical potential is less than or equal to the fourth electrical potential, and the third electrical potential is less than the fourth electrical potential.
13. The operating method as claimed in claim 12, wherein the first electrical potential is greater than the second electrical potential, and the current flows from the second electrical potential to the first electrical potential.
14. The operating method as claimed in claim 12, wherein the first electrical potential is less than the second electrical potential, and the current flows from the first electrical potential to the second electrical potential.
15. A one-time programmable memory cell, comprising:
    a gate dielectric layer disposed on a well;
    a gate electrode disposed on the gate dielectric layer;
    source/drain regions disposed in the well at the sides of the gate electrode, respectively;
    two lightly doped drains disposed on the source/drain regions, respectively;
    a first salicide layer disposed on one of the two lightly doped drains;
    a capacitive dielectric layer disposed on the gate electrode and the other of two lightly doped drains;
    a first conductive plug disposed on the first salicide layer; and
    a second conductive plug disposed on the capacitive dielectric layer, wherein the size of the first conductive plug is different form the size of the second conductive plug.
16. The one-time programmable memory cell as claimed in claim 15, wherein the capacitive dielectric layer is a resistive protection oxide layer or a self-aligned silicide block layer.
17. The one-time programmable memory cell as claimed in claim 15, wherein the capacitive dielectric layer is disposed on the gate electrode.
18. The one-time programmable memory cell as claimed in claim 15, further comprising:
    a second salicide layer disposed on the gate electrode.

19. The one-time programmable memory cell as claimed in claim 15, wherein the lightly doped drains have conductivity opposite the source/drain regions.

20. The one-time programmable memory cell as claimed in claim 15, further comprising:

a second salicide layer disposed on a portion of the gate electrode, wherein the capacitive dielectric layer is disposed on another portion of the gate electrode.

* * * * *